United States Patent
Huang et al.

(10) Patent No.: US 7,086,540 B2
(45) Date of Patent: Aug. 8, 2006

(54) STORAGE CASSETTE WITH POSITIONABLE STOPPERS AND METHOD FOR OPERATING THE SAME

(75) Inventors: Chun-Kai Huang, Shinjuang (TW); Ming-Hui Chang, Miaolih (TW)

(73) Assignee: Foxsemicon Integrated Technology, Inc., Miao-Li (TW)

( * ) Notice: Subject to any disclaimer, the term of this patent is extended or adjusted under 35 U.S.C. 154(b) by 167 days.

(21) Appl. No.: 10/605,996

(22) Filed: Nov. 12, 2003

(65) Prior Publication Data

US 2004/0108284 A1     Jun. 10, 2004

(30) Foreign Application Priority Data

Nov. 13, 2002  (TW) .................................. 91218164

(51) Int. Cl.
*A47G 19/08* (2006.01)
(52) U.S. Cl. .................................... 211/41.18; 211/183
(58) Field of Classification Search ............ 211/41.18, 211/182, 183; 206/454, 832, 710, 711, 833; 414/935–941
See application file for complete search history.

(56) References Cited

U.S. PATENT DOCUMENTS

| | | | |
|---|---|---|---|
| 5,584,401 A | | 12/1996 | Yoshida |
| 5,853,214 A | * | 12/1998 | Babbs et al. ................. 294/161 |
| 6,092,981 A | * | 7/2000 | Pfeiffer et al. .............. 414/810 |
| 6,186,344 B1 | * | 2/2001 | Park et al. .................. 211/41.1 |
| 6,378,538 B1 | * | 4/2002 | Brandenburg et al. ...... 134/201 |
| 6,523,701 B1 | | 2/2003 | Yoshida et al. |
| 6,573,198 B1 | * | 6/2003 | Boonstra et al. ............ 438/795 |
| 6,617,540 B1 | * | 9/2003 | Zehavi ................... 219/121.64 |
| 2003/0121870 A1 | * | 7/2003 | Beckhart et al. ......... 211/41.18 |
| 2004/0200788 A1 | * | 10/2004 | Shon et al. .............. 211/41.18 |

* cited by examiner

*Primary Examiner*—Jennifer E. Novosad
(74) *Attorney, Agent, or Firm*—Wei Te Chung

(57) ABSTRACT

A storage cassette (1) for accommodating substrates includes a box-shaped case (10) having a space and defining an entrance for inserting the substrates into the space; and a pair of stopping mechanisms (60) each including a top first locating mechanism (30), a bottom second locating mechanism (50) and a stopper (40) engaged therebetween. The stopping mechanisms are respectively located at opposite sides of the entrance. Each locating mechanism defines a first locating portion, a second locating portion closer to a corresponding side of the opposite sides than the first locating portion, and a connecting means portion interconnecting the first and second locating means. In a first position, the stopper is engaged in the first locating portion, and substrates accommodated in the cassette cannot be displaced; in a second position, the stopper is engaged in the second locating portion, and the substrates can be freely slid out from the space.

16 Claims, 6 Drawing Sheets

STORAGE CASSETTE WITH POSITIONABLE STOPPERS AND METHOD FOR OPERATING THE SAME

BACKGROUND OF INVENTION

1. Field of the Invention

The present invention relates to a cassette, and more particularly to a storage cassette which can conveniently store substrates therein.

2. Description of Related Art

In handling substrates, such as glass substrates for LCDs, storage cassettes are useful for holding and stowing the substrates and keeping them from contacting each other. The substrates are thus protected from damaging each other.

Referring to FIG. 6, a conventional cassette is described in Japan Yodogawa Kasei publication number H05-147680. The cassette 1 comprises an upper frame 2, a lower frame 5, a plurality of supporting bodies 3 therebetween, and a plurality of stoppers 4 therebetween. The supporting bodies 3 are plate-shaped, and define a plurality of grooves 31. Two stoppers 4 are shown, both being at a first end of the cassette 1. Thus, the frames 2, 5, the supporting bodies 3, and the stoppers 4 define a space therebetween for accommodating substrates. An opposite second end of the cassette 1 defines an entrance for inserting the substrates into the space. Another two stoppers 4 may then be attached to the cassette 1 at the second end, thereby securing the substrates in the cassette 1.

The cassette 1 may be transported from one place to another place in an upright orientation with no stoppers 4 attached to the second end thereof. However, if the cassette 1 is mishandled and tipped, the substrates may slide out from the entrance and be damaged. If stoppers 4 are attached to the second end of the cassette 1, this prevents the substrates from sliding out from the cassette 1. However, when the substrates need to be removed from the cassette 1, these stoppers 4 must be detached. The attachment and detachment of said stoppers 4 is troublesome and time-consuming. Moreover, the substrates are liable to be damaged during such attachment and detachment.

For the above reasons, an improved cassette with convenient stoppers is desired.

SUMMARY OF INVENTION

An object of the invention is to provide a storage cassette with conveniently positionable stoppers.

In order to achieve the object set forth above, a cassette for accommodating the substrates, includes: a box-shaped case having a space for retaining substrates and defining an entrance for inserting the substrates into the space; and a pair of stopping mechanisms each comprising a top first locating mechanism, a bottom second locating mechanism, and a stopper engaged therebetween. The stopping mechanisms are located at opposite sides of the entrance, each locating mechanism defines a first locating means, a second locating means closer to a corresponding side of the case than the first locating means, and a connecting means interconnecting the first locating means and the second locating means.

In a first position, the stopper is engaged in the first locating means, and substrates accommodated in the cassette cannot be displaced; in a second position, the stopper is engaged in the second locating means, and the substrates can be freely slid out from the space.

Further, the present invention provides a method for operating the storage cassette. The method comprises the steps of: providing the storage cassette comprising first and second locating holes, connecting slots interconnecting the first and second locating holes, guiding slots, a stopper having a first coupling ring and a second coupling ring engaged in the first locating holes, and a compressed spring; pulling the stopper down so that the spring is further compressed, and the first and second coupling rings are disengaged from the first locating holes respectively; moving the stopper to the second locating holes along the connecting slots and the guiding slots until the first and second coupling rings are received in the second locating holes; and releasing pressure on the stopper.

When moving the stopper from the first position to the second position, the stopper is simply slid from the first locating holes to the second locating holes along the connecting slots. In this process, no part of the cassette needs to be detached. The risk of misplacing loose parts is eliminated, and the operating process is simple and speedy.

Other objects, advantages and novel features of the invention will become more apparent from the following detailed description of the preferred embodiment of the invention as illustrated in the accompanying drawings, in which:

DETAILED DESCRIPTION

Reference will be made to the drawings to describe the invention in detail.

Figure 1:
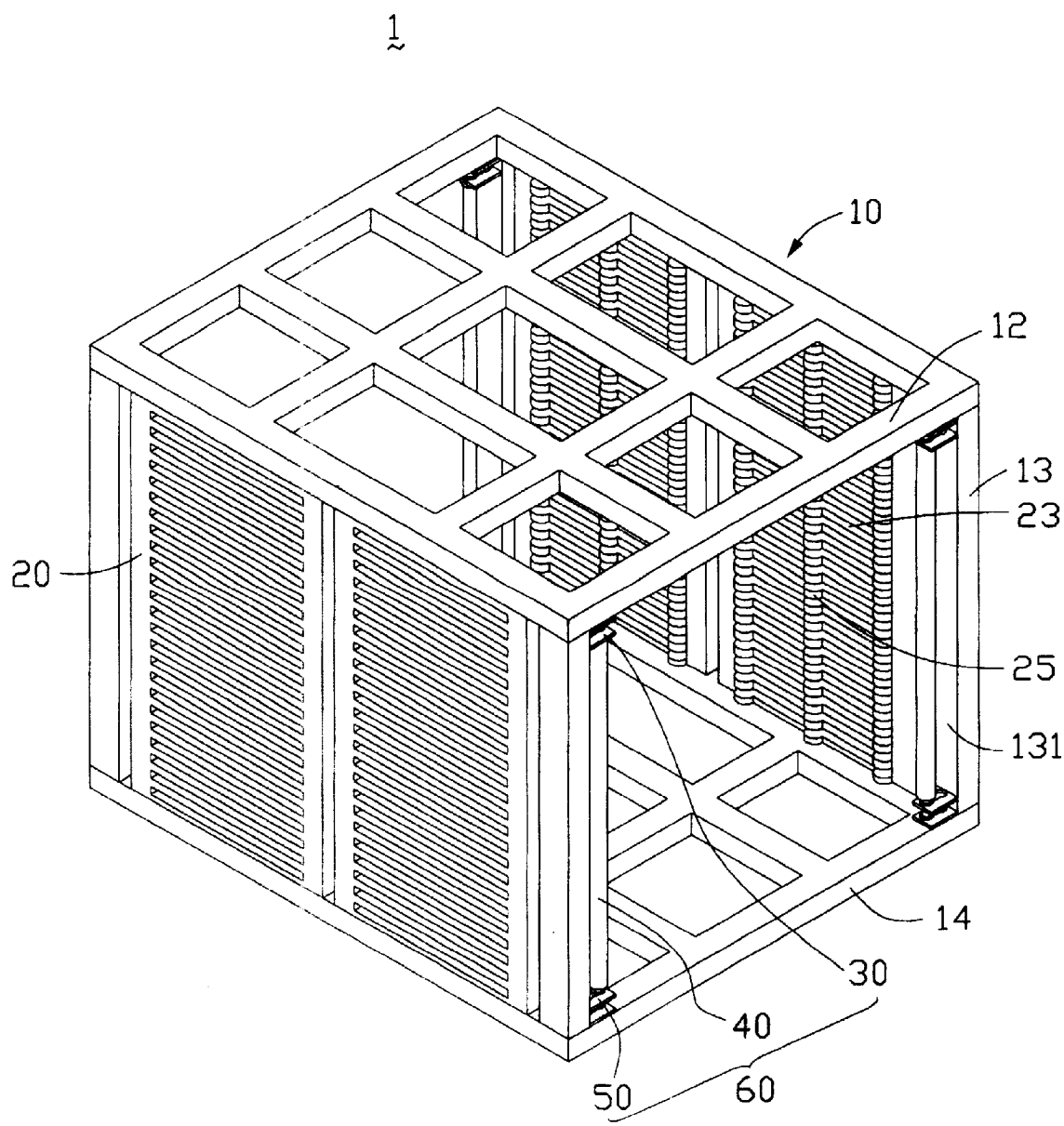
FIG. 1 is an isometric view of a cassette according to the present invention, showing stoppers thereof located in first locating holes.

Referring to FIG. 1, a cassette 1 of the present invention comprise a case 10 and four stopping mechanisms 60. The case 10 comprises an upper frame 12, a lower frame 14, four supporting rods 13, and two pairs of supporting plates 20. The frames 12, 14 and supporting rods 13 may be made of resin, and produced by way of injection molding. Two supporting rods 13 and two supporting plates 20 are located between the upper frame 12 and the lower frame 14 at each of opposite lateral sides of the case 10. The two supporting plates 20 and two supporting rods 13 at each of the opposite lateral sides of the case 10 are located in a common plane. Each supporting plate 20 comprises a plurality of parallel retaining ribs 23 on an inner face thereof. Each retaining rib 23 includes a plurality of coplanar protrusions 25 extending inwardly into the case 20. The case 10 can also be viewed as comprising two pairs of opposing supporting plates 20. That is, the supporting plates 20 in each pair of supporting plates 20 face each other, with the protrusion 25 thereof being symmetrically opposite each other. The retaining ribs 23 and protrusions 25 cooperate with each other to retain a plurality of substrates therebetween. Thus, the case 10 defines a space for accommodating the substrates, and two opposite entrances for inserting the substrates into the space.

Figure 2:
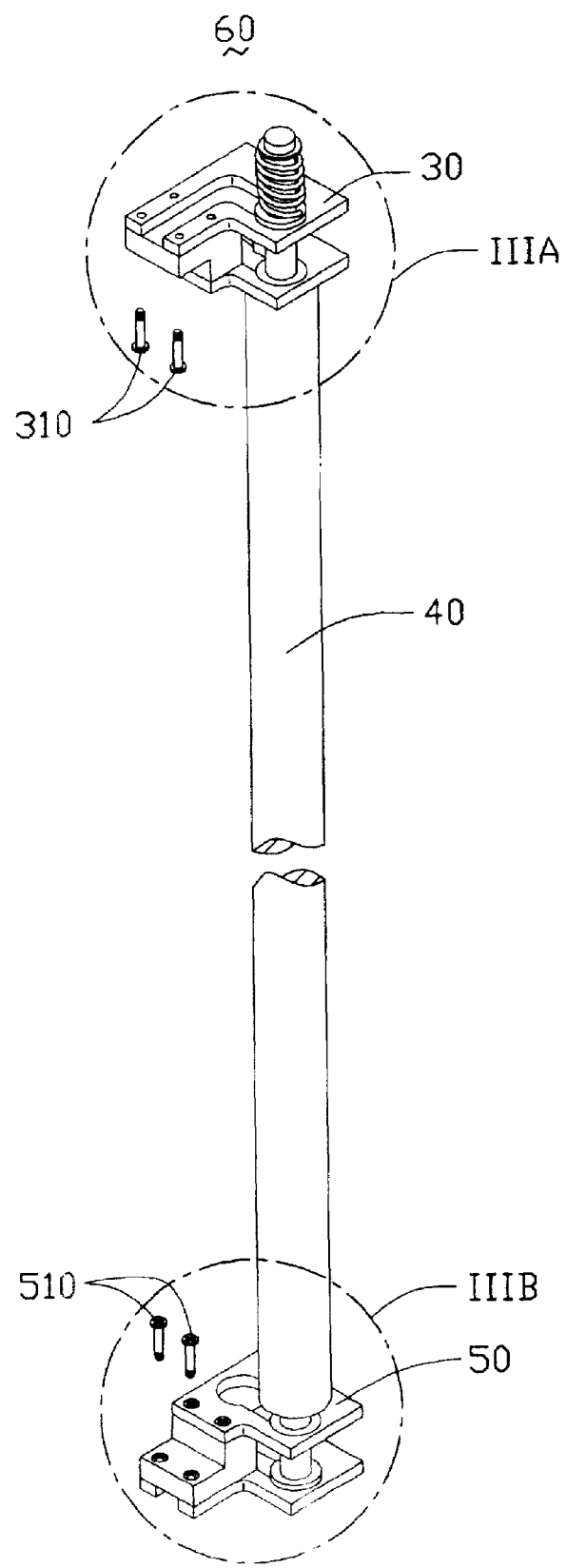
FIG. 2 is an enlarged, isometric view of a stopping mechanism of the cassette of FIG. 1.

Two stopping mechanisms 60 are located at respective opposite sides of each of the entrances. Referring also to FIG. 2, each stopping mechanism 60 comprises a first locating mechanism 30, a second locating mechanism 50, and a stopper 40 between the first locating mechanism 30 and the second locating mechanism 50.

Figure 3A:
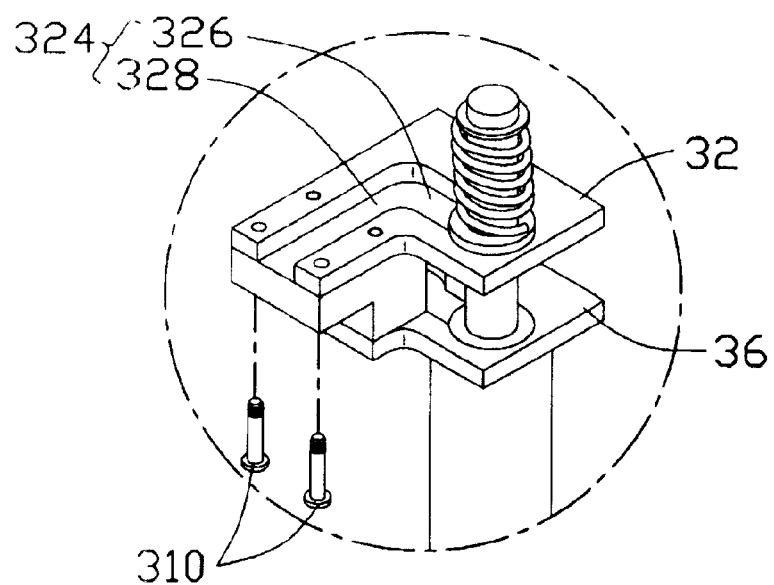
FIG. 3A and FIG. 3B are enlarged views of circled portions IIIA and IIIB of FIG. 2 respectively.
Figure 4:
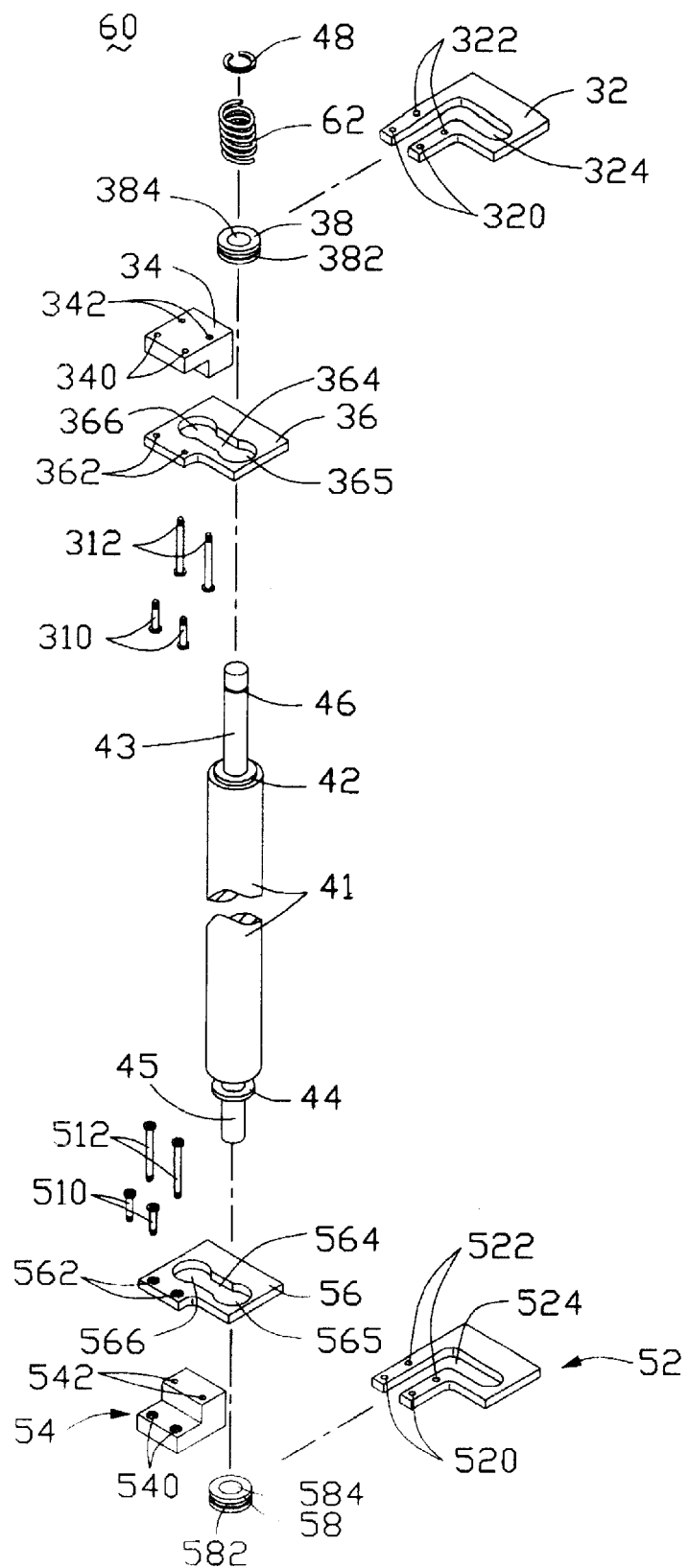
FIG. 4 is an exploded view of FIG. 2.
Figure 5:
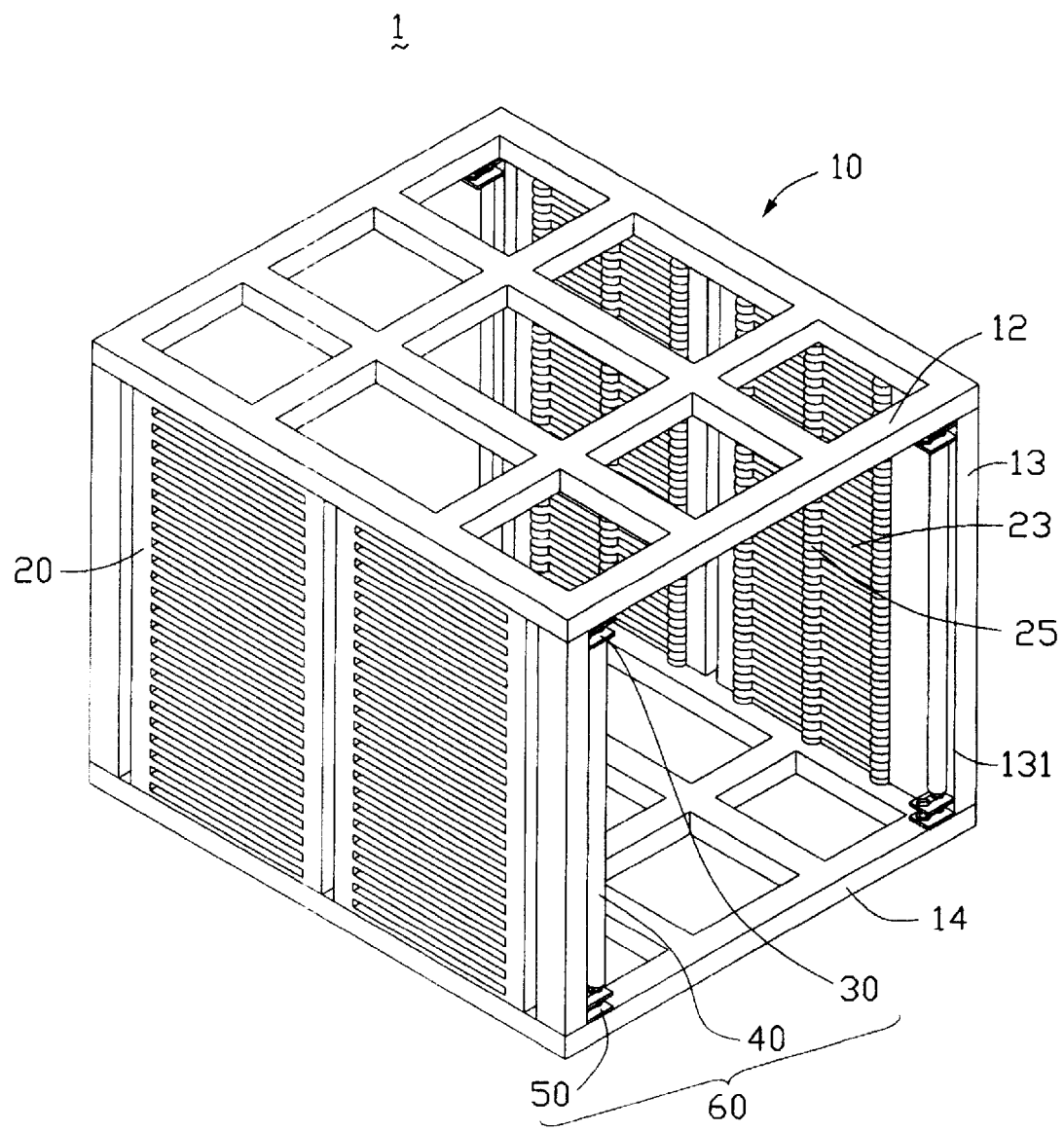
FIG. 5 is similar to FIG. 1, but showing the stoppers located in second locating holes.
Figure 6:
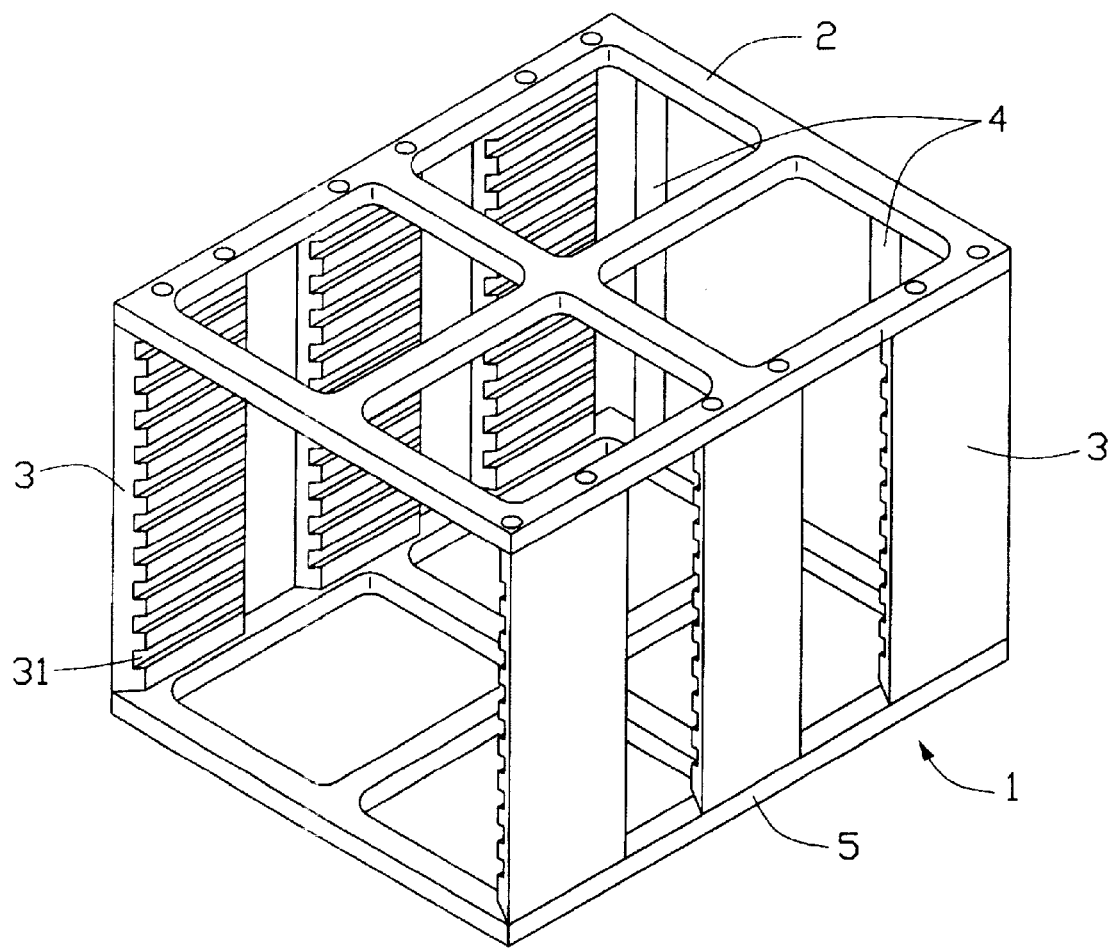
FIG. 6 is an isometric view of a conventional cassette.

The first locating mechanisms 30 and the second locating mechanisms 50 have essentially the same structure, therefore only one first locating mechanism 30 is described in detail herebelow. Referring also to FIG. 3A and FIG. 4, the locating mechanism 30 comprises a guiding plate 32 which is "L" shaped, a locating plate 36 parallel to the guiding plate 32, a spacer block 34 for connecting the guiding plate 32 and the locating plate 36 together, a sliding ring 38, a coil spring 62, and a generally "C" shaped clip 48. The guiding plate 32 defines an "L" shaped guiding slot 324. The guiding slot 324 has a uniform width, and comprises a first part 326 and a second part 328. A pair of first mounting holes 320 is defined in the guiding plate 32 at opposite sides of the guiding slot 324 respectively, near an opening (not labeled) of the guiding slot 324. A pair of second mounting holes 322 is defined in the guiding plate 32 at opposite sides of the guiding slot 324 respectively, more distant from the opening of the guiding slot 324 than the first mounting holes 320. The locating plate 36 defines a first locating hole 365, a second locating hole 366, and a narrowed connecting slot 364 interconnecting the first locating hole 365 and the second locating hole 366. A diameter of the first locating hole 365 is the same as that of the second locating hole 366, and greater than a width of the connecting slot 364. The locating plate 36 further defines a pair of second mounting holes 362 adjacent to the second locating hole 366. The spacer block 34 defines a pair of first mounting holes 340 and a pair of second mounting holes 342, corresponding to the first and second mounting holes 320, 322 of the guiding plate 32. The sliding ring 38 defines a central through hole 384, and an outer annular groove 382. A diameter of the sliding ring 38 at the annular groove 382 is slightly less than the width of the guiding slot 324.

Figure 3B:
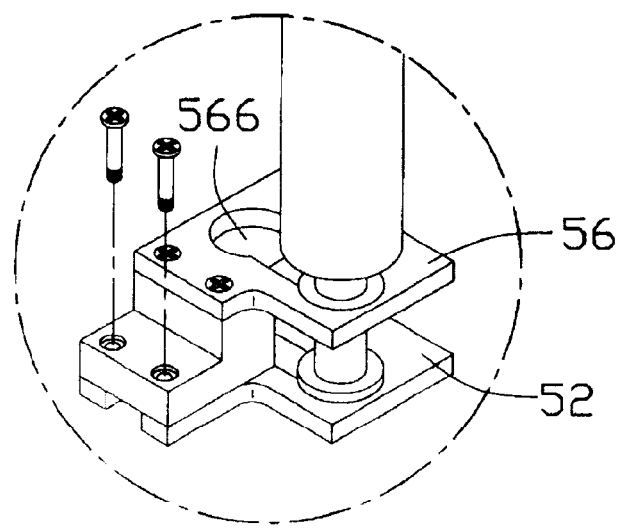

Referring also to FIG. 3B, each second locating mechanism 50 comprises a guiding plate 52, a locating plate 56 parallel to the guiding plate 52, a spacer block 54, and a sliding ring 58. The guiding plate 52 defines a guiding slot 524. The locating plate 56 defines a first locating hole 565, a second locating hole 566, and a narrowed connecting slot 564 interconnecting the first locating hole 565 and the second locating hole 566. The sliding ring 58 defines a through hole 584 and an annular groove 582. In addition, first mounting holes 520, 540 and second mounting holes 522, 542, 562 are respectively defined in the guiding plate 52, the spacer block 54 and the locating plate 56.

The stopper 40 is substantially an elongate cylinder, and comprises an upper end 43, a lower end 45 and an intermediate main body 41. Diameters of the upper and lower ends 43, 45 are identical, and less than a diameter of the main body 41. The stopper 40 defines a first coupling ring 42 between the upper end 43 and main body 41. A diameter of the first coupling ring 42 is less than that of the main body 41 and greater than that of the upper end 43. The diameter of the first coupling ring 42 is also slightly less than that of the first and second locating holes 365, 366. The lower end 45 defines a second coupling ring 44 a predetermined distance below the main body 41. A diameter of the second coupling ring 44 is the same as that of the first coupling ring 42. The upper end 43 defines an annular groove 46 near a top (not labeled) thereof. A diameter of the upper end 43 in the annular groove 46 is substantially the same as an inner diameter of the clip 48.

Assembly of each stopping mechanism 60 in the case 10 is as follows. The sliding rings 38, 58 are received in the openings of the guiding slots 324, 524, and slid to inmost ends of the guiding slots 324, 524. Screws 312 are sequentially received through the second mounting holes 362, 342, 322, thereby fixing the locating plate 36, the spacer block 34 and the guiding plate 32 together as an upper stack in that order. The connecting slot 364 is parallel to the first part 326 of the guiding slot 324, with nothing therebetween. The second part 328 of the guiding slot 324 is covered by the spacer block 34. Screws 512 are sequentially received through the second mounting holes 562, 542, 522, thereby fixing the locating plate 56, the spacer block 54 and the guiding plate 52 together as a lower stack in that order. The upper and lower ends 43, 45 of the stopper 40 are passed through the through holes 384, 584 of the sliding rings 38, 58 respectively. The first and second coupling rings 42, 44 are engaged in the first locating holes 365, 565 respectively. The coil spring 62 is placed around the upper end 43 on the sliding ring 38. The coil spring 62 is compressed, to enable the clip 48 to be snappingly received in the annular groove 46. The stopper 40 is thus engaged between the first locating mechanism 30 and the second locating mechanism 50. Screws 310 are sequentially received through the first mounting holes 340, 320 and the upper frame 12, thereby fixing said upper stack to the upper frame 12 adjacent to a corresponding supporting rod 13 at one of the entrances. Screws 510 are sequentially received through the first mounting holes 540, 520 and the lower frame 12, thereby fixing said lower stack to the lower frame 14 adjacent to the same supporting rod 13. The second locating holes 366, 566 are close to an inner side 131 of the supporting rod 13, and the connecting slots 364, 564 are oriented perpendicular to the corresponding supporting plate 20. If the first and second coupling rings 42, 44 are moved out of engagement in the first locating holes 365, 565, the upper and lower ends 43, 45 at the sliding rings 382, 582 are slidable along the guiding slots 324, 524.

In a first position, the first and second coupling rings 42, 44 are engaged in the first locating holes 365, 565 respectively. Due to elastic force exerted by the compressed coil spring 62, the stopper 40 cannot move up or down. In addition, because the diameter of the coupling rings 42, 44 is greater than that of the connecting slots 364, 564, the stopper 40 cannot move in horizontal directions. Therefore substrates accommodated in the cassette 1 cannot be displaced.

When the substrates need to be taken out from the cassette 1, the stopper 40 of each stopping mechanism 60 at one of the entrances is pulled down so that the coil spring 62 is further compressed. The first and second coupling rings 42, 44 are disengaged from the first locating holes 365, 565 respectively. The stopper 40 is then moved so that the upper and lower ends 43, 45 slide along the connecting slots 364, 564 and the guiding slots 324, 524 until the upper and lower ends 43, 45 are received in the second locating holes 366, 566. Pressure on the stopper 40 is then released. The coil spring 62 decompresses, and the stopper 40 moves up such that the first and second coupling rings 42, 44 are engaged in the second locating holes 364, 564. In this second position, the stoppers 40 of the stopping mechanisms 60 are close to the inner sides 131 of the supporting rods 13. The substrates are then freely slid out from the space along the protrusions 25.

In the above-described process, no part of the cassette 1 needs to be detached. The risk of misplacing loose parts is eliminated, and removal and insertion of the substrates is simple and speedy.

It is to be understood, however, than even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A storage cassette for accommodating substrates, comprising:
   a box-shaped case with a space for retaining substrates and defining an entrance for inserting the substrates into the space; and
   a stopping mechanism comprising a first locating mechanism, a second locating mechanism and a stopper engaged therebetween, wherein the first and second locating mechanisms are respectively located at opposite sides of the entrance of the case, and each locating mechanism defines a first locating means, a second locating means closer to a corresponding side of the opposite sides of the entrance of the case than the first locating means, and a connecting means interconnecting the first locating means and the second locating means;
   wherein in a first position, the stopper is engaged in the first locating means whereby substrates accommodated in the cassette cannot be displaced; and in a second position, the stopper is engaged in the second locating means whereby the substrates can be freely removed from the space.

2. The storage cassette as described in claim 1, wherein each locating mechanism defines a first locating hole, a second locating hole locating closer to the corresponding side of the opposite sides of the entrance of the case than the first locating hole, and a connecting slot interconnecting the first and second locating holes.

3. The storage cassette as described in claim 2, wherein a diameter of the first locating hole is the same as that of the second locating hole, and greater than width of the connecting slot.

4. The storage cassette as described in claim 2, wherein each locating mechanism further defines a guiding slot, at least a part of the guiding slot being parallel to the connecting slot.

5. The storage cassette as described in claim 4, wherein the first locating mechanism further comprises a sliding ring, a spring and a clip, and the second locating mechanism further comprises a sliding ring.

6. The storage cassette as described in claim 5, wherein the stopper comprises an upper end, a lower end and an intermediate main body, and diameters of the upper and lower ends are identical and less than a diameter of the main body.

7. The storage cassette as described in claim 6, wherein the stopper defines a first coupling ring between the upper end and the main body, and a second coupling ring a predetermined distance below the main body.

8. The storage cassette as described in claim 7, wherein a common diameter of the first and second coupling rings is less than that of the main body and greater than that of the upper end.

9. The storage cassette as described in claim 8, wherein the diameter of the first and second coupling rings is slightly less than that of the first and second locating holes.

10. The storage cassette as described in claim 9, wherein the upper end defines an annular groove near a top thereof, and a diameter of the upper end at the annular groove is substantially the same as an inner diameter of the clip.

11. The storage cassette as described in claim 10, wherein the sliding ring defines a central through hole and an outer annular groove, and a diameter of the sliding ring at the annular groove is slightly less than a width of the guiding slot.

12. The storage cassette as described in claim 11, wherein the sliding rings are received in the guiding slots at the annular grooves thereof.

13. The storage cassette as described in claim 12, wherein the upper and lower ends are received through the through holes of the sliding rings respectively.

14. The storage cassette as described in claim 13, wherein the upper and lower ends are received in the sliding rings so that the upper and lower ends can slide along the guiding slots.

15. The storage cassette as described in claim 14, wherein the first and second coupling rings are engaged in the first locating holes.

16. The storage cassette as described in claim 15, wherein the spring is located around the upper end on the sliding ring thereof, and the clip is engaged in the annular groove of the upper end thereby compressing the spring.

* * * * *